(12) United States Patent
Fukui

(10) Patent No.: US 8,088,642 B2
(45) Date of Patent: Jan. 3, 2012

(54) THIN-FILMED FIELD EFFECT TRANSISTOR AND MAKING METHOD

(75) Inventor: Ikuo Fukui, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 123 days.

(21) Appl. No.: 12/350,715

(22) Filed: Jan. 8, 2009

(65) Prior Publication Data

US 2009/0124051 A1    May 14, 2009

Related U.S. Application Data

(62) Division of application No. 10/925,986, filed on Aug. 26, 2004.

(30) Foreign Application Priority Data

Aug. 28, 2003    (JP) ................................ 2003-304019

(51) Int. Cl.
*H01L 51/40* (2006.01)

(52) U.S. Cl. ............. 438/99; 438/149; 257/40; 257/347

(58) Field of Classification Search ................ 438/1, 15, 438/99, 149; 257/40, 347
See application file for complete search history.

(56) References Cited

U.S. PATENT DOCUMENTS

| | | | |
|---|---|---|---|
| 4,322,524 A | 3/1982 | Onda et al. | |
| 5,347,144 A | 9/1994 | Garnier et al. | |
| 5,705,826 A | 1/1998 | Aratani et al. | |
| 5,912,473 A | 6/1999 | Wakita et al. | |
| 6,300,988 B1 | 10/2001 | Ishihara et al. | |
| 6,503,831 B2 * | 1/2003 | Speakman | 438/674 |
| 6,683,333 B2 | 1/2004 | Kazlas et al. | |
| 6,774,393 B2 | 8/2004 | Murti et al. | |
| 2003/0071259 A1 | 4/2003 | Yoshida | |

FOREIGN PATENT DOCUMENTS

| | | |
|---|---|---|
| EP | 1 302 949 A2 | 4/2003 |
| JP | 59-31521 B2 | 8/1984 |
| JP | 5-508745 A | 12/1993 |
| JP | 8-191162 A | 7/1996 |
| WO | WO-01/27998 A1 | 4/2001 |

* cited by examiner

*Primary Examiner* — Ori Nadav
(74) *Attorney, Agent, or Firm* — Birch, Stewart, Kolasch & Birch, LLP

(57) ABSTRACT

In a thin-film field effect transistor with a MIS structure, the materials of which the semiconductor and insulating layers are made are polymers which are dissolvable in organic solvents and have a weight average molecular weight of more than 2,000 to 1,000,000. Use of polymers for both the semiconductor layer and insulating layer of TFT eliminates such treatments as patterning and etching using photoresists in the prior art circuit-forming technology, reduces the probability of TFT defects and achieves a reduction of TFT manufacture cost.

3 Claims, 1 Drawing Sheet

THIN-FILMED FIELD EFFECT TRANSISTOR AND MAKING METHOD

CROSS-REFERENCE TO RELATED APPLICATION

This is a Divisional of pending nonprovisional U.S. application Ser. No. 10/925,986 filed on Aug. 26, 2004, which claims priority under 35 U.S.C. §119(a) on Patent Application No. 2003-304019 filed in Japan on Aug. 28, 2003, the entire contents of all are hereby incorporated by reference.

TECHNICAL FIELD

This invention relates to thin-film field effect transistors (TFTs) utilizing silicon semiconductors or compound semiconductors, especially for use in liquid crystal displays, and a method of fabricating the same.

BACKGROUND ART

TFTs utilizing silicon semiconductors or compound semiconductors are used in common integrated circuits and in wide-spreading other applications. In particular, the use of TFTs in liquid crystal displays is well known. Nowadays LC displays are making continuous progress toward larger size and more precise definition. The requirement to incorporate a greater number of TFTs corresponding to the number of pixels becomes stronger than ever.

However, ordinary metal based semiconductors used in the art cannot avoid the problem that slight defective pixels are caused by the defects of TFTs formed on the substrate as a result of treatments including patterning and etching using photoresists during circuitry formation on the substrate. Such treatments impose a certain limit in reducing the cost of TFT manufacture. This is also true for other flat displays such as plasma displays and organic EL displays when TFTs are used therein.

The recent trend toward larger size and more precise definition tends to increase the probability of defection in the TFT manufacture. It is thus strongly desired to minimize such TFT defects.

For TFTs with a metal-insulator-semiconductor (MIS) structure, attempts have been made to use organic materials as the insulator and semiconductor. For example, JP-A 5-508745 (WO 9201313 or U.S. Pat. No. 5,347,144) describes that a device using an insulating organic polymer having a dielectric constant of at least 5 as the insulating layer and a polyconjugated organic compound having a weight average molecular weight of up to 2,000 as the semiconductor layer exerts a field effect and has a mobility of carriers of about $10^{-2}$ $cm^2V^{-1}s^{-1}$. Since the semiconductor layer is formed by evaporating α-sexithienyl as an organic semiconductor material, treatments including patterning and etching using photoresists are necessary, failing to achieve a cost reduction.

SUMMARY OF THE INVENTION

An object of the present invention is to provide thin-film field effect transistors (TFTs) having a higher carrier mobility than prior art TFTs and minimized defects, and a method of fabricating the same.

The inventor has discovered that in a TFT with a metal-insulator-semiconductor (MIS) structure, a simple approach of using organic solvent-soluble polymers as the materials of which the semiconductor and insulating layers are made is successful in achieving a greater carrier mobility than in the prior art.

Accordingly, the present invention provides a thin-film field effect transistor with an MIS structure, wherein the materials of which the semiconductor and insulating layers are made are polymers which are dissolvable in organic solvents and have a weight average molecular weight of more than 2,000 to 1,000,000.

In another embodiment of the invention, a thin-film field effect transistor is fabricated by a process involving the steps of dissolving polymers having a weight average molecular weight (Mw) of more than 2,000 to 1,000,000 in organic solvents, applying the resulting polymer solutions, and drying the applied polymer solutions, thereby forming a semiconductor layer and an insulating layer.

According to the invention, use of polymers for both the semiconductor layer and insulating layer of TFT eliminates such treatments as patterning and etching using photoresists or the like in the circuit forming technology using prior art metal based semiconductors and insulators, reduces the probability of TFT defects and achieves a reduction of TFT manufacture cost.

DESCRIPTION OF THE PREFERRED EMBODIMENTS

Figure 1:
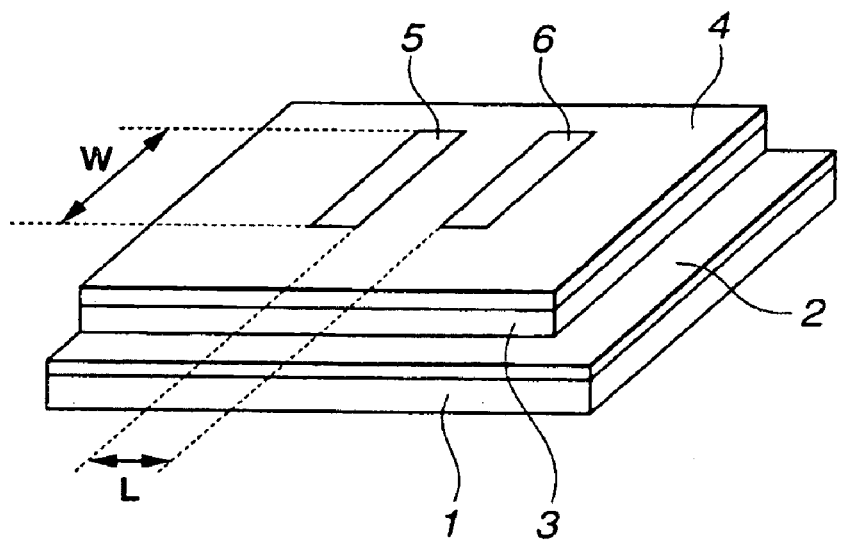
FIG. 1 is a perspective view of TFT in one embodiment of the invention.

Referring to FIG. 1, a TFT in one embodiment of the invention is illustrated as comprising a substrate 1 of $SiO_2$ or the like, a metal layer 2 formed on the substrate 1 and serving as a gate electrode, an insulating layer 3 formed on the metal layer 2, a semiconductor layer 4 formed on the insulating layer 3, and source and drain electrodes 5 and 6 formed on the semiconductor layer 4.

The metal layer 2 used herein may be a commonly used ITO (indium tin oxide) film, or a film of a single metal such as Au, Cu or Al or a laminate metal film of Au/Ti, Cu/Ti or Al/Ti, deposited by the physical vapor deposition (PVD) or metal organic chemical vapor deposition (MOCVD) method. Since the objects of the invention favor that the metal layer 2 be formed by printing, it is recommended to use electroconductive metal pastes if no practical problems are encountered.

In the inventive TFT, the material of which the insulating layer is made is a polymer or high-molecular weight compound which is dissolvable in an organic solvent and has a weight average molecular weight (Mw) of more than 2,000 to 1,000,000, and preferably an insulating polymer having cyano groups. Examples include cyanoethyl pullulan, cyanoethyl cellulose, cyanoethyl polyvinyl alcohol, and polyacrylonitrile. These insulating polymers having cyano groups are readily obtainable. For example, cyanoethyl pullulan is obtained by reacting a pullulan resin with acrylonitrile in the presence of an alkali catalyst (see JP-B 59-31521). The degree of substitution of cyano groups (e.g., degree of substitution of cyanoethyl groups in the case of cyanoethyl pullulan) is desirably at least 80 mol %, more desirably at least 85 mol %. This is because the concentration of polar groups or cyano groups must be above a certain level in order to produce a TFT having a fully improved mobility, and a more content of residual hydroxyl groups leads to an increase in dielectric loss as a loss factor and is sometimes undesirable for the objects of the invention.

In the inventive TFT, the material of which the semiconductor layer is made is a polymer or high-molecular weight compound which is dissolvable in an organic solvent and has a weight average molecular weight (Mw) of more than 2,000 to 1,000,000. Although no other limits are imposed on the polymer for the semiconductor layer, the polymer should be dissolvable in an organic solvent in which the insulating layer is not dissolvable. This is because it is generally believed that in forming the semiconductor layer and the insulating layer in a lay-up manner, the interfacial state does not become uniform.

Past studies on organic TFT employed a method of forming an organic semiconductor layer on an organic insulating film by evaporation as described in JP-A 5-508745, and a method of forming only an organic semiconductor layer on an inorganic insulating layer. One exemplary method involves dissolving both an organic semiconductor material and an organic insulating material in an identical organic solvent to form solutions, coating and drying the organic insulating material solution to form an organic insulating layer, then applying the organic semiconductor material solution to the organic insulating layer. At this point, the organic insulating material is slightly dissolved at the coating interface. Eventually the interface between layers of the obtained laminated film after drying is disordered. By contrast, the present invention solves the problem by using different organic solvents for dissolution of a semiconductor material and an insulating material, that is, by combining two organic solvents with two materials such that one of the materials is not dissolvable in one of the organic solvents.

Specifically, suitable polymers for forming the semiconductor layer include polythiophenes, polypyrroles, polyanilines, polyacetylenes, polythienylene vinylenes, and polyphenylene vinylenes. Of these, polythiophenes such as poly(3-hexylthiophene) are preferred because of solubility in organic solvents, good processability, stability and a high carrier mobility.

Suitable organic solvents for dissolving the polymers of which the insulating layer is made include N-methyl-2-pyrrolidone, dimethylformamide, acetone, acetonitrile, γ-butyrolactone, etc. Suitable organic solvents for dissolving the polymers of which the semiconductor layer is made include chloroform, toluene, hexane, alcohols, etc. In either case, the solvent may be used alone or in admixture of two or more.

According to the invention, a thin-film field effect transistor is fabricated by applying a solution of a polymer having a Mw of more than 2,000 to 1,000,000 in a first organic solvent to a gate electrode in the form of a metal layer, drying the applied polymer solution to form an insulating layer on the metal layer, and forming on the insulating layer a semiconductor layer which is dissolvable in a second organic solvent in which the insulating layer is not dissolvable. This method may be implemented using well-known techniques. For example, a metal layer serving as a gate electrode is formed by a sputtering technique on the substrate which is selected from glass and ordinary polymer sheets. Alternatively, a metal layer is formed by applying a metal paste or electroconductive polymer to the substrate by a spin coating, screen printing or ink jet printing technique, followed by drying. Commercially available ITO glass may also be used.

An insulating layer is then formed on the thus formed gate electrode, by applying a solution of the insulating layer-forming material in a first organic solvent by a spin coating, screen printing or ink jet printing technique, followed by drying. In this case, the insulating layer may preferably have a thickness of 0.2 to 10 m, more preferably 0.5 to 3 □m. Too thin insulating layer may cause a large leakage current. Too thick insulating layer may require a large driving voltage.

Next, a semiconductor layer is formed on the insulating layer by applying a solution of the semiconductor layer-forming material in a second organic solvent in which the insulating polymer is not dissolvable, by a spin coating, screen printing or ink jet printing technique, followed by drying. The surface of the insulating layer may be previously subjected to physical treatment, typically known rubbing treatment in order that semiconductor molecules be aligned at the interface between insulating and semiconductor layers.

Finally, source and drain electrodes are formed on the semiconductor layer by a sputtering technique. Alternatively, a metal paste or electroconductive polymer is applied by a screen printing or ink jet printing technique, followed by drying.

The inventive TFT has a structure including an insulating layer formed on a gate electrode in the form of a metal layer and a semiconductor layer formed on the insulating layer. When an electric potential is applied to the gate to produce an electric field, electric charges are created within the semiconductor in proximity to the insulating layer due to a field effect, thereby forming a conductive region, called the channel, within the semiconductor layer between source and drain electrodes formed on the semiconductor layer. This means that the interfacial state between insulating and semiconductor layers is crucial. The flatter interface, the better performs the device.

EXAMPLE

Examples of the invention are given below by way of illustration and not by way of limitation.

Example 1

There were furnished cyanoethyl pullulan having a substitution of cyanoethyl of 85.2 mol % (CyEPL, Shin-Etsu Chemical Co., Ltd., CR-S, Mw=49,000) as an insulating layer material and poly(3-hexylthiophene) (P3HT, Aldrich, Mw=87,000) as an organic semiconductor layer material. The organic solvent in which P3HT was dissolved was chloroform, in which CyEPL was insoluble. A TFT was fabricated using these materials and evaluated as follows.

On a glass ($SiO_2$) substrate, a gate electrode was formed by depositing Ti to a thickness of 5 nm and then Au to a thickness of 20 nm, using an RF sputtering technique at room temperature and a back pressure of $10^{-4}$ Pa.

An insulating layer was then formed on the gate electrode by dissolving 15 wt % CyEPL as the insulating layer material in N-methyl-2-pyrrolidone, passing the solution through a 0.2-micron membrane filter, spin coating the solution, and drying at 100° C. for one hour.

A semiconductor layer of 50 nm thick was then formed on the insulating layer by dissolving 0.8 wt % P3HT in chloroform, passing the solution through a 0.2-micron membrane filter, spin coating the solution, and drying at 100° C. for one hour.

The substrate was cooled at −20° C. Au was deposited to a thickness of 300 nm on the organic semiconductor layer through a metal mask, using an RF sputtering technique at a back pressure below $10^{-5}$ Pa. There were formed two gold electrodes of 4 mm wide spaced a distance of 50 μm (see FIG. 1, L=50 μm and W=4 mm) serving as source and drain electrodes.

Comparative Example 1

There were furnished cyanoethyl pullulan having a substitution of cyanoethyl of 85.2 mol % (CyEPL, Shin-Etsu Chemical Co., Ltd., CR-S) as an insulating layer material and copper phthalocyanine (CuPc) as an organic semiconductor layer material. A TFT was fabricated using these materials and evaluated as follows.

On a glass ($SiO_2$) substrate, a gate electrode was formed by depositing Ti to a thickness of 5 nm and then Au to a thickness of 20 nm, using an RF sputtering technique at room temperature and a back pressure of $10^{-4}$ Pa.

An insulating layer was then formed on the gate electrode by dissolving 15 wt % CyEPL as the insulating layer material in N-methyl-2-pyrrolidone, passing the solution through a 0.2-micron membrane filter, spin coating the solution, and drying at 100° C. for one hour.

A semiconductor layer of 50 nm thick was then formed on the insulating layer by depositing CuPc, using an RF sputtering technique at room temperature and a back pressure of $10^{-5}$ Pa.

The substrate was cooled at −20° C. Au was deposited to a thickness of 300 nm on the organic semiconductor layer through a metal mask, using an RF sputtering technique at a back pressure below $10^{-5}$ Pa. There were formed two gold electrodes of 4 mm wide spaced a distance of 50 µm serving as source and drain electrodes.

Comparative Example 2

There were furnished $SiO_2$ as an insulating layer material and copper phthalocyanine (CuPc) as an organic semiconductor layer material. A TFT was fabricated using these materials and evaluated as follows.

A p-type doped silicon substrate was annealed in a furnace to form an oxide film ($SiO_2$) of 300 nm thick as an insulating film. Then only the back surface of the substrate which had not been mirror finished was treated with hydrofluoric acid to remove the oxide film. On only the back surface thus treated, a gate electrode was formed by depositing Ti to a thickness of 5 nm and then Au to a thickness of 20 nm, using an RF sputtering technique at room temperature and a back pressure of $10^{-4}$ Pa.

A semiconductor layer of 50 nm thick was then formed on the surface of the oxide film serving as the insulating layer, by depositing CuPc, using an RF sputtering technique at room temperature and a back pressure below $10^{-5}$ Pa.

The substrate was cooled at −20° C. Au was deposited to a thickness of 300 nm on the organic semiconductor layer through a metal mask, using an RF sputtering technique at a back pressure below $10^{-5}$ Pa. There were formed two gold electrodes of 4 mm wide spaced a distance of 50 µm serving as source and drain electrodes.

[TFT Evaluation]

Each of the devices thus fabricated was placed in a vacuum prober where the substrate was heated at 50° C. and allowed to stand in a vacuum (below $10^{-4}$ Torr) for one hour. In the prober under vacuum, light-shielded conditions, the TFT characteristics were determined by a semiconductor parameter analyzer SCS4200 by Keithley.

The results are shown in Table 1.

Figure 2:
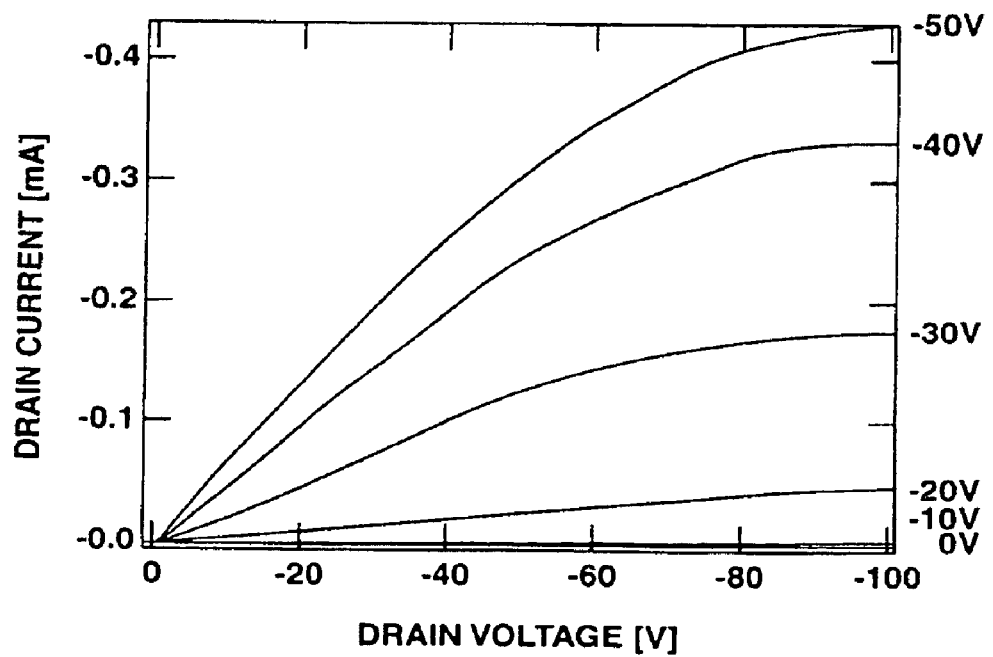
FIG. 2 is a graph of drain current versus drain voltage of TFT in an example of the invention.

Drain current versus voltage ($I_{SD}$-$V_{SD}$) curves representing the field effect of TFT of Example 1 are shown in the graph of FIG. 2.

TABLE 1

| | Insulating layer material | Semiconductor layer material | Mobility ($cm^2V^{-1}s^{-1}$) | Threshold (V0) |
|---|---|---|---|---|
| Example 1 | CyEPL | P3HT | $4.0 \times 10^{-1}$ | −9.0 |
| Comparative Example 1 | CyEPL | CuPc | $2.0 \times 10^{-3}$ | −7.0 |
| Comparative Example 2 | $SiO_2$ | CuPc | $2.0 \times 10^{-4}$ | −0.13 |

The results of Comparative Examples 1 and 2 suggest that use of CyEPL as the organic insulating layer material provides a greater mobility than conventional $SiO_2$. Although the TFT of Example 1 was fabricated by the method which is generally believed to achieve no improvement in mobility due to disordered interface, that is, in which both the organic insulating layer and the organic semiconductor layer are formed by coating and drying, the TFT of Example 1 exhibits a significantly high mobility. The inventive TFT has an improved mobility because the channel formation would be enhanced by polar groups aligned at the interface between insulating and semiconductor layers, when a potential is applied to the gate.

Japanese Patent Application No. 2003-304019 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for fabricating a thin-film field effect transistor, comprising the steps of:
    applying a solution of a first polymer having a weight average molecular weight of more than 2,000 to 1,000,000 and a first organic solvent to a gate electrode,
    wherein the first polymer is selected from the group consisting of cyanoethylpullulan, cyanoethyl cellulose, cyanoethyl polyvinyl alcohol and polyacrylonitrile,
    wherein the first organic solvent, is at least one selected from the group consisting of N-methyl-2-pyrrolidone, dimethylformamide, acetonitrile and γ-butyrolactone, and
    wherein the gate electrode is in the form of a metal layer;
    drying the solution applied to the gate electrode to form an insulating layer on the gate electrode;
    forming on the insulating layer a semiconductor layer from a second polymer having a weight average molecular weight of more than 2,000 to 1,000,000 selected from the group consisting of polythiophenes, polypyrroles, polyanilines, polyacetylenes, polythienylene vinylenes and polyphenylene vinylenes, wherein the second polymer is dissolved in a second organic solvent selected from the group consisting of chloroform, toluene, hexane and alcohols in which the insulating layer is not dissolvable so that the interfacial state between the insulating layer formed from the first polymer solution and the semiconductor layer formed from the second polymer solution is flat; and
    forming source and drain electrodes on the semiconductor layer;
    wherein said transistor has a drain current of 0 mA when the drain voltage is 0 V in a gate voltage of 0 to −50 V.

2. The method according to claim 1, further comprising: drying the semiconductor layer.

3. The method according to claim 1, wherein the insulating layer has a thickness of 0.2 to 10 µm.

* * * * *